United States Patent
El-Siblani et al.

(10) Patent No.: US 8,126,580 B2
(45) Date of Patent: *Feb. 28, 2012

(54) DEVICE AND METHOD FOR PRODUCING A THREE-DIMENSIONAL OBJECT BY MEANS OF MASK EXPOSURE

(75) Inventors: Ali El-Siblani, Dearborn Heights, MI (US); Volker Schillen, Dusseldorf (DE); Hendrik John, Hunxe (DE)

(73) Assignee: Envisiontec GmbH, Gladbeck (DE)

( * ) Notice: Subject to any disclaimer, the term of this patent is extended or adjusted under 35 U.S.C. 154(b) by 0 days.

This patent is subject to a terminal disclaimer.

(21) Appl. No.: 12/815,326

(22) Filed: Jun. 14, 2010

(65) Prior Publication Data

US 2010/0249979 A1    Sep. 30, 2010

Related U.S. Application Data

(63) Continuation of application No. 11/796,709, filed on Apr. 26, 2007, now Pat. No. 7,783,371.

(60) Provisional application No. 60/796,159, filed on Apr. 28, 2006.

(30) Foreign Application Priority Data

Apr. 26, 2006  (DE) .......................... 10 2006 019 963

(51) Int. Cl.
    *G06F 19/00*     (2006.01)
(52) U.S. Cl. .......................................... 700/98; 700/120
(58) Field of Classification Search .............. 700/95–98, 700/117–121
    See application file for complete search history.

(56) References Cited

U.S. PATENT DOCUMENTS

| | | | |
|---|---|---|---|
| 4,752,498 | A | 6/1988 | Fudim et al. |
| 4,837,379 | A | 6/1989 | Weinberg |
| 4,929,402 | A | 5/1990 | Hull |
| 4,999,143 | A | 3/1991 | Hull et al. |
| 5,093,130 | A | 3/1992 | Fujii et al. |
| 5,137,662 | A | 8/1992 | Hull et al. |
| 5,139,338 | A | 8/1992 | Pomerantz et al. |
| 5,143,663 | A | 9/1992 | Leyden et al. |
| 5,157,423 | A | 10/1992 | Zur |
| 5,171,490 | A | 12/1992 | Fudim |

(Continued)

FOREIGN PATENT DOCUMENTS

DE     4105314 A1     8/1991

(Continued)

OTHER PUBLICATIONS

"Rapid Prototyping Using Three-Dimensional Computer Vision",—Koivunen et al.,University of Pennsylvania Department of Computer and Information Science Technical report No. MS-CIS-92070. 1992.

(Continued)

*Primary Examiner* — M. N. Von Buhr
(74) *Attorney, Agent, or Firm* — Hansen IP Law PLLC

(57) ABSTRACT

Device for producing a three-dimensional object by solidification of a material solidifiable under the action of electromagnetic radiation by means of energy input via an imaging unit comprising a predetermined number of discrete imaging elements (pixels), said device comprising a computer unit, an IC and/or a software implementation respectively with the ability of adjusting and/or controlling the energy input via a specific gray value and/or color value in a voxel matrix.

20 Claims, 8 Drawing Sheets

U.S. PATENT DOCUMENTS

| | | |
|---|---|---|
| 5,173,266 A | 12/1992 | Kenney |
| 5,174,931 A | 12/1992 | Almquist et al. |
| 5,236,637 A | 8/1993 | Hull |
| 5,247,180 A | 9/1993 | Mitcham et al. |
| 5,248,456 A | 9/1993 | Evans, Jr. et al. |
| 5,263,130 A | 11/1993 | Pomerantz et al. |
| 5,268,994 A | 12/1993 | Keskes |
| 5,289,214 A | 2/1994 | Zur |
| 5,298,208 A | 3/1994 | Sibley et al. |
| 5,306,446 A | 4/1994 | Howe |
| 5,345,391 A | 9/1994 | Hull et al. |
| 5,360,891 A | 11/1994 | Wenzel et al. |
| 5,360,981 A | 11/1994 | Owen et al. |
| 5,391,072 A | 2/1995 | Lawton et al. |
| 5,427,733 A | 6/1995 | Parasco et al. |
| 5,437,820 A | 8/1995 | Brotz |
| 5,447,822 A | 9/1995 | Hull et al. |
| 5,454,069 A | 9/1995 | Knapp et al. |
| 5,510,077 A | 4/1996 | Dinh et al. |
| 5,529,473 A | 6/1996 | Lawton et al. |
| 5,545,367 A | 8/1996 | Bae et al. |
| 5,569,431 A | 10/1996 | Hull |
| 5,571,471 A | 11/1996 | Hull |
| 5,573,721 A | 11/1996 | Gillette |
| 5,630,981 A | 5/1997 | Hull |
| 5,651,934 A | 7/1997 | Almquist et al. |
| 5,653,925 A | 8/1997 | Batchelder |
| 5,817,206 A | 10/1998 | Forderhase et al. |
| 5,823,778 A | 10/1998 | Schmitt et al. |
| 5,858,746 A | 1/1999 | Hubbell |
| 5,891,382 A | 4/1999 | Almquist et al. |
| 5,894,036 A | 4/1999 | Tylko |
| 5,897,825 A | 4/1999 | Fruth et al. |
| 5,902,537 A | 5/1999 | Almquist et al. |
| 5,945,058 A | 8/1999 | Manners et al. |
| 5,980,813 A | 11/1999 | Narang et al. |
| 6,013,099 A | 1/2000 | Dinh et al. |
| 6,027,324 A | 2/2000 | Hull |
| 6,048,487 A | 4/2000 | Almquist et al. |
| 6,051,179 A | 4/2000 | Hagenau |
| 6,124,858 A | 9/2000 | Ge et al. |
| 6,153,034 A | 11/2000 | Lipsker |
| 6,158,946 A | 12/2000 | Miyashita |
| 6,171,610 B1 | 1/2001 | Vacanti et al. |
| 6,180,050 B1 | 1/2001 | Arai et al. |
| 6,280,727 B1 | 8/2001 | Prior et al. |
| 6,281,903 B1 | 8/2001 | Martin et al. |
| 6,334,865 B1 | 1/2002 | Redmond et al. |
| 6,352,710 B2 | 3/2002 | Sawhney et al. |
| 6,391,245 B1 | 5/2002 | Smith |
| 6,420,698 B1 | 7/2002 | Dimsdale et al. |
| 6,490,496 B1 | 12/2002 | Dacey |
| 6,500,378 B1 | 12/2002 | Smith |
| 6,501,483 B1 | 12/2002 | Wong et al. |
| 6,508,971 B2 | 1/2003 | Leyden et al. |
| 6,547,552 B1 | 4/2003 | Fudim |
| 6,630,009 B2 | 10/2003 | Moussa et al. |
| 6,733,267 B2 | 5/2004 | Chapman et al. |
| 6,764,636 B1 | 7/2004 | Allanic et al. |
| 6,813,594 B2 | 11/2004 | Guertin et al. |
| 6,828,068 B2 | 12/2004 | Progler et al. |
| 6,833,231 B2 | 12/2004 | Moussa et al. |
| 6,833,234 B1 | 12/2004 | Bloomstein et al. |
| 6,942,830 B2 | 9/2005 | Mulhaupt et al. |
| 6,974,656 B2 | 12/2005 | Hinczewski |
| 6,989,225 B2 | 1/2006 | Steinmann |
| 6,995,830 B2 | 2/2006 | de Jager |
| 7,006,887 B2 | 2/2006 | Nagano et al. |
| 7,052,263 B2 | 5/2006 | John |
| 7,073,883 B2 | 7/2006 | Billow |
| 7,083,405 B2 | 8/2006 | Koyagi et al. |
| 7,128,866 B1 | 10/2006 | Henningsen |
| 7,133,041 B2 | 11/2006 | Kaufman et al. |
| 7,195,472 B2 | 3/2007 | John |
| 7,215,430 B2 | 5/2007 | Kacyra et al. |
| 7,239,373 B2 * | 7/2007 | Tinnemans et al. ............. 355/67 |
| 7,261,542 B2 | 8/2007 | Hickerson et al. |
| 7,317,510 B2 * | 1/2008 | Bontekoe et al. ............ 355/67 |
| 7,403,213 B1 | 7/2008 | Morgan et al. |
| 7,467,939 B2 | 12/2008 | Sperry et al. |
| 7,506,299 B2 * | 3/2009 | Socha et al. ................. 716/132 |
| 7,550,251 B2 * | 6/2009 | McLean et al. .............. 430/300 |
| 7,568,904 B2 | 8/2009 | Koyagi et al. |
| 7,573,561 B2 | 8/2009 | Fries |
| 7,636,610 B2 | 12/2009 | Schillen et al. |
| 7,639,416 B2 * | 12/2009 | Meisburger ................. 359/290 |
| 7,646,919 B2 * | 1/2010 | Olsson et al. ................ 382/199 |
| 7,783,371 B2 | 8/2010 | John |
| 7,785,093 B2 | 8/2010 | Holmboe et al. |
| 7,790,093 B2 | 9/2010 | Shkolnik et al. |
| 7,831,328 B2 | 11/2010 | Schillen |
| 7,894,921 B2 | 2/2011 | John et al. |
| 2001/0028495 A1 | 10/2001 | Quate et al. |
| 2001/0048183 A1 | 12/2001 | Fujita |
| 2002/0028854 A1 | 3/2002 | Allanic et al. |
| 2002/0155189 A1 | 10/2002 | John |
| 2003/0021823 A1 | 1/2003 | Landers et al. |
| 2003/0067539 A1 | 4/2003 | Doerfel et al. |
| 2003/0074096 A1 | 4/2003 | Das et al. |
| 2003/0173714 A1 | 9/2003 | Ueno |
| 2003/0205849 A1 | 11/2003 | Farnworth |
| 2004/0008309 A1 | 1/2004 | Yamahara et al. |
| 2004/0027363 A1 | 2/2004 | Allen |
| 2004/0028293 A1 | 2/2004 | Allen et al. |
| 2004/0118309 A1 | 6/2004 | Fedor et al. |
| 2005/0023710 A1 | 2/2005 | Brodkin et al. |
| 2005/0084766 A1 | 4/2005 | Sandstrom |
| 2005/0091346 A1 | 4/2005 | Krishnaswami et al. |
| 2005/0208168 A1 | 9/2005 | Hickerson et al. |
| 2005/0248061 A1 | 11/2005 | Shkolnik et al. |
| 2005/0248062 A1 | 11/2005 | Shkolnik et al. |
| 2005/0259785 A1 | 11/2005 | Zhang |
| 2005/0288813 A1 | 12/2005 | Yang et al. |
| 2006/0055724 A1 | 3/2006 | Krawczyk et al. |
| 2006/0078638 A1 | 4/2006 | Holmboe et al. |
| 2006/0161287 A1 | 7/2006 | Simonis |
| 2006/0192312 A1 | 8/2006 | Wahlstrom et al. |
| 2006/0239588 A1 | 10/2006 | Hull et al. |
| 2006/0249884 A1 | 11/2006 | Partanen et al. |
| 2007/0074659 A1 | 4/2007 | Wahlstrom |
| 2007/0075458 A1 | 4/2007 | Wahlstrom et al. |
| 2007/0075459 A1 | 4/2007 | Reynolds et al. |
| 2007/0075460 A1 | 4/2007 | Wahlstrom et al. |
| 2007/0075461 A1 | 4/2007 | Hunter et al. |
| 2007/0077323 A1 | 4/2007 | Stonesmith et al. |
| 2007/0120842 A1 | 5/2007 | Hess |
| 2007/0254490 A1 * | 11/2007 | Jain .............................. 438/736 |
| 2007/0257055 A1 | 11/2007 | Scott et al. |
| 2007/0259066 A1 | 11/2007 | Sperry et al. |
| 2007/0260349 A1 | 11/2007 | John et al. |
| 2008/0038396 A1 | 2/2008 | John et al. |
| 2008/0054531 A1 | 3/2008 | Kerekes et al. |
| 2008/0055581 A1 | 3/2008 | Rogers et al. |
| 2008/0099667 A1 * | 5/2008 | Stark et al. .............. 250/227.18 |
| 2008/0113293 A1 | 5/2008 | Shkolnik et al. |
| 2008/0169586 A1 | 7/2008 | Hull et al. |
| 2008/0169589 A1 | 7/2008 | Sperry et al. |
| 2008/0170112 A1 | 7/2008 | Hull et al. |
| 2008/0179786 A1 | 7/2008 | Sperry et al. |
| 2008/0179787 A1 | 7/2008 | Sperry et al. |
| 2008/0181977 A1 | 7/2008 | Sperry et al. |
| 2008/0206383 A1 | 8/2008 | Hull et al. |
| 2008/0217818 A1 | 9/2008 | Holmboe et al. |
| 2008/0226346 A1 | 9/2008 | Hull et al. |
| 2008/0231731 A1 | 9/2008 | Hull et al. |
| 2008/0309665 A1 | 12/2008 | Gregory, II |
| 2009/0020901 A1 | 1/2009 | Schillen et al. |
| 2009/0044166 A1 * | 2/2009 | Ozawa .......................... 716/19 |
| 2009/0130449 A1 | 5/2009 | El-Siblani |
| 2009/0146081 A1 * | 6/2009 | Stark ......................... 250/492.2 |
| 2009/0146344 A1 | 6/2009 | El-Siblani |
| 2009/0191489 A1 | 7/2009 | Sandstrom |
| 2010/0125356 A1 | 5/2010 | Shkolnik et al. |

FOREIGN PATENT DOCUMENTS

| | | |
|---|---|---|
| DE | 4102257 A1 | 7/1992 |
| DE | 4125534 | 2/1993 |

| | | | |
|---|---|---|---|
| DE | G9319405 U1 | 5/1994 |
| DE | 4340108 C2 | 8/1997 |
| DE | 19727554 A1 | 1/1999 |
| DE | 29911122 U1 | 11/1999 |
| DE | 19838797 A1 | 3/2000 |
| DE | 19929199 A1 | 1/2001 |
| DE | 10003374 C1 | 8/2001 |
| DE | 10018987 | 10/2001 |
| DE | 20106887 U1 | 10/2001 |
| DE | 19716240 | 12/2003 |
| DE | 69909136 | 5/2004 |
| DE | 69909136 T2 | 5/2005 |
| DE | 102004022961 A1 | 12/2005 |
| EP | 0250121 A2 | 12/1987 |
| EP | 0426363 A2 | 10/1990 |
| EP | 0484086 | 5/1992 |
| EP | 0435564 B1 | 4/1995 |
| EP | 0466422 B1 | 5/1995 |
| EP | 0484086 B1 | 9/1995 |
| EP | 1156922 B1 | 4/2000 |
| EP | 1026564 | 8/2000 |
| EP | 1192041 B1 | 1/2001 |
| EP | 1250995 A1 | 10/2002 |
| EP | 1250997 A1 | 10/2002 |
| EP | 1270185 A1 | 1/2003 |
| EP | 0958912 B1 | 3/2003 |
| EP | 1338846 A2 | 8/2003 |
| EP | 1674243 A2 | 6/2006 |
| EP | 1880830 A1 | 7/2006 |
| EP | 1849587 A1 | 3/2007 |
| EP | 1894704 A1 | 3/2008 |
| EP | 1950032 A2 | 7/2008 |
| EP | 2011631 A1 | 1/2009 |
| EP | 1849587 B1 | 7/2009 |
| FR | 2254194 | 7/1975 |
| FR | 2583334 | 12/1986 |
| FR | 2634686 | 2/1990 |
| FR | 2692053 | 12/1993 |
| JP | 04371829 | 12/1992 |
| JP | 08192469 | 7/1996 |
| WO | 95/11007 A1 | 4/1995 |
| WO | 95/15841 A1 | 6/1995 |
| WO | 9515841 | 6/1995 |
| WO | 96/00422 A1 | 1/1996 |
| WO | 9945435 A1 | 9/1999 |
| WO | 01/00390 A1 | 1/2001 |
| WO | 01/12679 A1 | 2/2001 |
| WO | 01/72501 A1 | 10/2001 |
| WO | 0172501 | 10/2001 |
| WO | 03/059184 A2 | 7/2003 |
| WO | 2005110722 A1 | 11/2005 |
| WO | 2009053100 A1 | 4/2009 |
| WO | 2009053100 A8 | 4/2009 |

OTHER PUBLICATIONS

"A Parameterized Mask Model for Lithography Simulation",—Zhu. Cadence Research Labs, Berkeley, CA. DAC '09, Jul. 26-31, 2009.

*3D Systems, Inc.* v. *Envisiontec, Inc. et al.* Special Masters Report and Recommendation on the Parties' Summary Judgement Motions.
IEE Super Resolution article abstract vol. 20, issue 3, pp. 21-36, May 2003.
Wobulation, saved as PDF from the Internet; wikipedia definition, citing several resolution-relate patents.
http://www.hp.com/hpinfo/newsroom/press/2004/040609a.html "HP Technology Doubles the Resolution of Digital Projection Displays," Jun. 9, 2004.
W. Allen, R. Ulichney, "Wobulation: Doubling the Addressed Resolution," SID 05 Digest, 2005.
C. Sun, et al., "Projection Micro-Stereolithography Using Digital Micro-Mirror Dynamic Mask," Sensors and Actuators A 121 (2005) 113-120.
Opposition to EP 1,849,587, dated Apr. 8, 2010.
S. Ventura, et al., "Freeform Fabrication of Functional Silicon Nitride Components by Direct Photoshaping," Mat. Res. Soc. Symp. Proc., vol. 625 (2000).
K. Takahashi, "A new Application of DMD to Photolithography and Rapid Prototyping System," Institute of Electronics, Information, and Communication Engineers.
Burns, "Automatic Fabrication Improving Productivity in Manufacturing," 1993 (ISBN 0-13-110462-3).
Wohlers Report 2000, "Rapid Prototyping & Tooling State of the Industry Annual Worldwide Progress Report," T. Wohlers, Wohlers Association, Inc., Fort Collins, Colorado (2000).
Stark, G.B., et al., "Biological Matrices and Tissue Reconstruction," Springer Publications, Berlin (1998).
E. Sachs, et al., "Three Dimensional Printing: Rapid Tooling and Prototypes Directly from CAD Model," Journal of Engineering for Industry, 114:481-488 (1992).
Willem M. Kuthreiber, et al., "Cell Encapsulation Technology and Therapeutics," Birkhauser (Boston 1998).
Rudiger Landers, et al., "Desktop Manufacturing of /complex Objects, Prototypes and Biomedical Scaffolds by Means of Computer-Assisted Design Combined with Computer-Guided 3D Plotting of Polymers and Reactive Oligomers," Macromolecular Materials and Engineering, 282:17-22 (2000).
Toshiyuki Okada, et al., "Tissue Reactions to Subcutaneously Implanted, Surface-Modified Silicones, Journal of Biomedical Materials Research," 27:1509-1518 (1993).
Ingrid A.M. Relou, et al., "Effect of Culture Conditions on Endothelial Cell Growth and Responsiveness," Tissue & Cell, 30(5):525-538 (1998).
V.V. Nikolaychik, et al., "A New Cryoprecipitate Based Coating for Improved Endothelial Cell Attachment and Growth on Medical Grade Artificial Surfaces," ASAIO Journal 40:M846-M852 (1994).
Special Master's Report & Recommendation, dated May 12, 2009 from *3D Systems, Inc.* v. *Envisiontec, Inc., et al.*, (E. D. MI, Case No. 2:05-CV-74891).
Reply Brief of 3D Systems in Opposition to EP 1 849 587, dated May 13, 2011.

* cited by examiner

Geometry with differently sized holes and cylinders

Generated bitmap with missing structures of the size 200 μm in diameter

DEVICE AND METHOD FOR PRODUCING A THREE-DIMENSIONAL OBJECT BY MEANS OF MASK EXPOSURE

CROSS-REFERENCE TO RELATED APPLICATIONS

This application is a continuation of U.S. patent application Ser. No. 11/796,709, filed Apr. 26, 2007, now U.S. Pat. No. 7,783,371, the entirety of which is hereby incorporated by reference and which claims the benefit of U.S. Provisional Application No. 60/796,159, filed Apr. 28, 2006, the entirety of which is hereby incorporated by reference.

The invention relates to a device for producing a three-dimensional object by solidification of a material, in particular a photopolymer, solidifiable under the action of electromagnetic radiation by means of energy input via an imaging unit comprising a predetermined number of discrete imaging elements (pixels). In particular, this invention relates to methods in which solidification is based on the exposure by means of a raster mask, with the smallest physical resolution in the mask given by the size of a pixel and the Spatial Light Modulator (SLM) technology being applied to the imaging unit.

BACKGROUND ART

The literature specifies highly varying methods for the construction of three-dimensional objects of "light-hardening" photopolymers, cf. "Automated Fabrication—Improving Productivity in Manufacturing" by Marshall Burns, 1993 (ISBN 0-13-119462-3).

Known possibilities are, inter alia, the exposure by
a) multimedia projector
b) LC display (reflexive, transmissive)
c) LED or laser diode line (which is moved over the area orthogonally to the line)
d) light valve technology (MEMS).

These methods are described in the following patents:
US Patent US005247180A "Stereolithographic Apparatus and Method of use" by Texas Instruments Inc., September 1993;
US Patent US005980813A "Rapid Prototyping using multiple materials" by SRI International, November 1999;
Utility model publication DE G 93 19 405.6 "Device for the production of a three-dimensional object (model) according to the principle of photo solidification" by the Research Center Informatics at the University of Karlsruhe, December 1993;
According to a similar method, the utility model publication DE 299 11 122 U1 "Device for producing a three-dimensional object", DeltaMed inter alia, June 1999 describes an application for the generation of micro-technical, three-dimensional components.
EP 1250997A (=US2002155189A) "Device for producing a three-dimensional object" by Envision Technologies GmbH, April 2002.
German Patent DE69909136T "Rapid Prototyping Device and Rapid Prototyping Method", July 2003 (equivalent: European Patent EP 1156922 "Rapid Prototyping Apparatus and Method of Rapid Prototyping", August 2003) of DICON AS Lystrup, Denmark.
WO 01/00390 A by HAP, Sitec Industrietechnologie and DELTAMED Medizinprodukte GmbH.
WO 2005/110722 A of Envisiontec GmbH.

With laser-based systems for photo-polymerization, the light output in the exposure point is provided by the energy setting of the laser beam, whereby the hardening depth of the solidifiable material, such as the photopolymer, can be controlled in that point.

For selective hardening, the laser beam is scanned over the cross-sectional area to be correspondingly hardened.

The contours of the cross-sectional area to be hardened can be scanned by the laser beam as a curve.

A cross-sectional area is typically exposed at once with systems for photo-polymerization based on mask projection by means of projection systems, especially with the SLM technology. The white areas of the projected image harden the solidifiable material (normally a photopolymer); the black areas do not. The contours of the cross-sectional area to be hardened can only be presented in rasters; the resolution depends on the number of image points or, respectively, pixels and on the size of the projected image.

With the above mentioned WO 01/00390 A, the intensity of beams is controlled by controlling the permeability of the mask, wherein the intensity may be controlled via the selection of gray levels of a transmission LCD. An allocation by different intensities is, however, performed with respect to a layer only depending on whether solidified regions are underneath or not. There is no mentioning in WO 01/00390 of an adjustment and/or a control of an energy input in a voxel matrix as according to the present invention. The present invention deals with resolution and fine adjustment in a voxel matrix; while grey level gradation depending on whether an underneath hardened layer is absent or present for connection is not required in the present invention.

In WO 2005/110722 A, a multiple exposure is carried out on the subpixel level for improving the resolution along the outside and inside contours of the cross-sectional areas of the object to be generated, said exposure consisting of a sequence of a plurality of images offset on the subpixel level in the image/building plane, wherein a separate mask/bitmap is generated for every offset image. A gray level adjustment is taken into account for the contour pixels obtained by the subpixel offset. There is neither any mentioning in WO 2005/110722 A of an adjustment and/or a control of an energy input in a voxel matrix as according to the present invention.

Neither WO 01/00390 A nor WO 2005/110722 show how the resolution and the fine adjustment in the image plane can be improved, and how native inhomogeneities of the light source can be balanced better.

OBJECT OF THE INVENTION

It is the object of the invention to improve device and method for the production of a three-dimensional object by solidification of a material solidifiable under the action of electromagnetic radiation, by means of energy input via an imaging unit comprising a predetermined number of discrete imaging elements (pixels) so that a higher precision, higher resolution and fine adjustment and/or a higher homogeneity of the system will be realized.

SOLUTION OF THE PROBLEM

In a first embodiment, the invention provides a device for the production of a three-dimensional object by solidification of a material solidifiable under the action of electromagnetic radiation by means of energy input via an imaging unit comprising a predetermined number of discrete imaging elements (pixels), said device comprising a computer unit, an IC and/or a software implementation respectively with the ability of adjusting and/or controlling the energy input via a specific gray value and/or color value.

It has been found to be particularly advantageous to selectively adjust and/or control the energy input via a specific grey value and/or color value in a voxel matrix. Further preferably, a raster mask (bitmap) is used without pixel shift.

In the present invention, the term voxel matrix means a rastered arrangement of solidified voxels (volume pixels), wherein a voxel images an image point of a pixel matrix, and the hardening depth per voxel depends on the energy input per image point.

In a preferred development of the first embodiment, the capability for adjusting and/or controlling a specific gray value and/or color value can be advantageously provided specifically and individually per pixel.

In a second embodiment, the invention further provides a device for the production of a three-dimensional object by means of solidification of a material solidifiable under the action of electromagnetic radiation by means of energy input via a raster imaging unit comprising a predetermined number of discrete imaging elements (pixels) arranged as a dot, a line or as a matrix, wherein the imaging unit composes the image from the pixels and thus forms a raster mask (bitmap), wherein the imaging unit is designed such that at least one part of the pixels can be allocated to more than two energy levels for a variable energy input. Also in this second embodiment, it has been found to be particularly advantageous to selectively adjust and/or control the energy input via a specific grey value and/or color value in a voxel matrix. Further preferably, a raster mask (bitmap) is used without pixel shift.

The allocation is suitably provided by the supply or, respectively, provision of more than two energy levels per bitmap and preferably specifically per pixel. In a preferred development of the second embodiment, the design of the imaging unit can be advantageously such that the allocation or, respectively, the classification of pixels into the more than two energy levels can be provided specifically and individually per pixel.

The more than two energy levels preferably include:
a1) ON and OFF states, by an essentially complete energy transmission (white) or, respectively, by an essentially complete energy blocking without energy transmission (black), in transmissive systems (especially with light valves); or
a2) ON and OFF states, by an essentially complete energy reflection into the optical axis (white in the projection image) or, respectively, by an essentially complete reflection out of the optical axis into an optical absorber (black in the projection image), in reflexive systems (in particular in a Digital Micromirror Device [DMD] or a Liquid Crystal on Silicon [LCoS] for digital light processing [DLP]); and additionally
b1) a predetermined, desired number of gray levels, or
b2) a predetermined, desired number of color values. The color values can represent a color tone and/or a color density or, respectively, intensity.

In accordance with the invention, the adjustment or setting via color values in comparison with gray values can be particularly advantageous because a significantly better fine adjustment will then be possible, specifically in relation to the photopolymer correspondingly used.

In a preferred development of the first and second embodiments, the imaging unit of the device can be included in a projection unit. The imaging unit is typically designed such that the number of pixels is constant and is arranged in the plane in a mutually spatially fixed manner.

In a preferred development of the first and second embodiments, the imaging unit can be the device of the type of an emitting dot, an emitting line or an emitting matrix. A resolution improvement is particularly achieved when the imaging unit comprises a Spatial Light Modulator (SLM) or light valves in MEMS technology or LEDs.

The present invention furthermore provides a method for the production of a three-dimensional object by means of solidifying a material solidifiable under the action of electromagnetic radiation by means of energy input via an imaging unit comprising a predetermined number of discrete imaging elements (pixels), wherein the light output for solidification of the material is controlled for at least a part of the pixels via a defined gray value and/or color value. Due to this measure, the depth of penetration of the electromagnetic radiation for solidifying the material can be advantageously set significantly finer and variable and precisely per pixel by selectively adjusting and/or controlling the energy input via a specific grey value and/or color value in a voxel matrix, preferably a raster mask (bitmap) being used without pixel shift.

Information on gray value and/or color value can be stored in the raster image (bitmap) per image point (pixel).

In a preferred embodiment of the method according to the invention, the exposure mask or, respectively, the image will be projected by means of a projection unit into the building plane for the solidification of the material.

In a preferred embodiment of the device and the method according to the invention, a compensation mask is generated with gray values for the entire projection image on the basis of the measured native light output distribution, said compensation mask causing, in a superposition to the bitmap generated for the solidification, a homogeneous distribution of the light output over the entire projection image. The homogeneity of the light output distribution will thus be considerably improved. When the measurement of the native light output distribution occurs in the projection image of the building plane, the generation of the compensation mask can occur independently of the bitmap generated in the building process and thus involves not only exposed but also unexposed surfaces.

In a preferred embodiment of the method according to the invention, the gray values in the compensation mask are interpolated between the measuring points, thus a more uniform gray value distribution is achieved over the entire compensation mask.

In a particularly preferred embodiment of the device and the method according to the invention, it is determined which pixels are overlapped how much by the graphics. Depending on the result of this determination, a correspondingly weighted gray value or a specific color value will be allocated pixel—specifically. Due to this measure, the resolution can be significantly improved for very fine structures. Alternatively or additionally, these measures take into account antialiasing in rastering a contour line, thus eliminating or, respectively, reducing the so-called aliasing artifacts in the edge/contour areas which develop with the rastering of vector graphics—here of the cross-sectional structure to be exposed.

According to the invention, multiple exposure and/or a subpixel offset is not desired in this case.

In another, particularly preferred embodiment of the device and the method according to the invention, different areas of various area expansion will be identified in a cross-sectional image which was generated for solidification. The pixels of the respectively identified areas are allocated or provided with uniform gray values and/or color values so that gray value and/or color value extend over the corresponding areas. Thus, for example, larger area structures can be darkened according to their expansion, whereas smaller area structures are radiated lighter. Thus, a uniform hardening depth will be obtained over the entire cross-sectional image and thus over the entire area to be exposed.

In a preferred embodiment of the device and the method according to the invention, increased hardening of selected areas will occur through the single or multiple exposure of a voxel matrix, by providing a corresponding gray value/color value allocation within the voxel matrix. The hardening depth in the selected areas, which are allocated without or with a lower grey value/color value, is preferably several-fold, i.e. at least the three-fold, preferably at the least the four-fold, and further preferred by at least the five-fold of the hardening depth of the remaining areas.

In a preferred embodiment of the device and the method according to the invention, information regarding the gray Value and/or the color value per image point (pixel) is calculated online on a current basis for each raster image (bitmap).

DESCRIPTION OF THE PREFERRED EMBODIMENTS AND THE ADVANTAGES OF THE INVENTION

Figure 1:
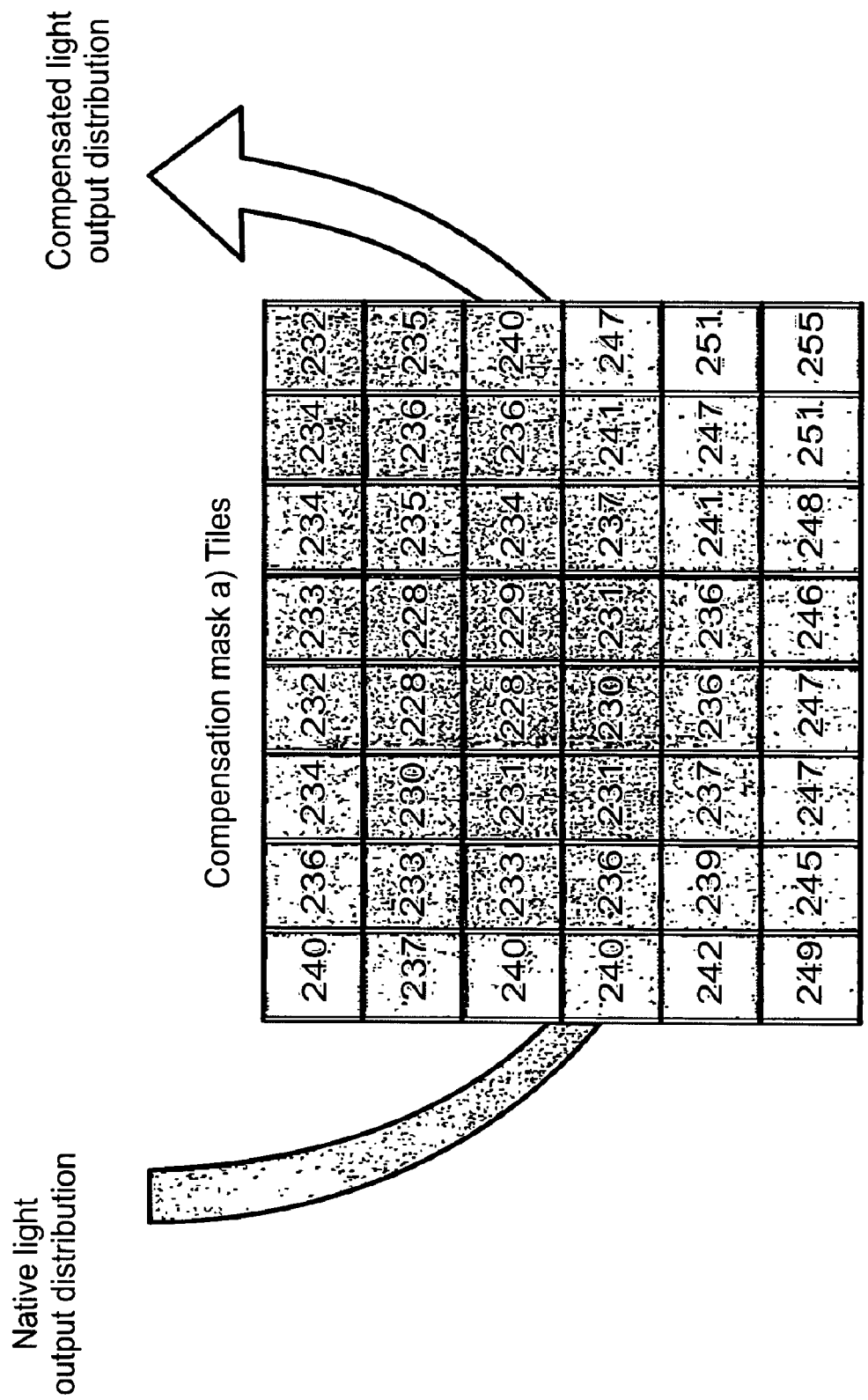
FIG. 1 schematically shows a concept of the present invention concerning gray value or color value adjustment on a macroscopic level according to an embodiment using simple tiling by compensation mask.

Device and method according to the invention allow to improve the homogeneity of the light output distribution. Specifically, light output control by means of gray levels and/or color values on the macroscopic level or specifically at the pixel level on the microscopic level can improve the imaging performance by a bitmapping that determines a voxel matrix. Imaging losses can be reduced which are caused by a pure ON/OFF (BLACK/WHITE) raster. The resolution performance in the building plane is improved without having to increase the resolution of the imaging unit. Thus, the quality of the constructed component will be improved overall with regard to surface smoothness, accuracy of details, and tolerances.

Particularly in projection systems with SLM technology, the light output distribution over the image surface can be significantly improved (versus a conventional inhomogeneous distribution of possibly up to 50% in absolute terms). Accordingly, compared with the state of the art, the dependence or, respectively, the influence is reduced by means of the invention, with regard to a) the light source used; b) the optical system for coupling the light energy (specifically to the SLM) and c) the vignetting of the projection optics.

Even if the properties of the light source will change over time, this can be corrected according to the invention so that variable errors and changing homogeneity distributions can be compensated. If desired, even constant errors—which can be caused by the optical system for coupling the light energy to the SLM and the projection optics—can be prevented with the invention by compensating any homogeneity deviations.

If desired, with the concept according to the invention, the problem can also be dealt with that the light intensity varies depending on the size of the exposed area structure (higher light intensity with larger, contiguous areas, lower light intensity with small, filigree area structures) which is why—without the measure according to the invention—the inhomogeneity of the light output distribution in the projected image can result in corresponding deviations in the hardening depth of the photopolymer and thus in errors/deviations, imprecisions in the component upon the application of mask projection by means of the SLM technology.

By means of the gray level control and/or the color value control, the light output distribution can be adjusted over the overall image (gray mask compensation), i.e. a macro-adjustment, but as well as on a pixel level, i.e. a micro-adjustment, but without changing the native condition of the light source and/or the imaging optics. Micro-adjustment is best done selectively, i.e. depending on the cross-sectional structure to be imaged, and during the generation of the bitmap of the cross sectional area for the voxel matrix currently produced.

Furthermore, a significantly better fine adjustment of the energy input can be achieved by means of the measure of allocating at least a part of the pixels more than two energy levels, providing, particularly in addition to the normal ON and OFF states (white/black), additional energy levels by a predetermined number of gray levels, preferably by a predetermined number of color values.

By means of the invention, operating conditions, particularly the hardening depth, also can be largely kept constant over the entire cross-sectional imaging structure, or can be specifically selectively manipulated for the purpose of overexposure or underexposure of selected areas, which will result in an improvement of the quality of the constructed component. A better resolution and a better fine adjustment will be achieved especially if the following are comprised as parameters for overexposure or underexposure:
  degree of overlapping of the raster pixels by the vector graphic; and/or
  size of the area of the cross-sectional image.
Also, deviations can be compensated which are caused e.g. by aging of the light source or other optical errors.

The gray level control and/or the color value control can be technically performed most suitably entirely by software. A computer unit such as a CPU, an IC and/or a software implementation respectively with the corresponding function can be used as suitable elements for this purpose. The system can thus be used very flexibly and for all mask projection systems based on SML technology.

Another major advantage is that the selective, pixel-precise light output adjustment can be provided, independent of the exposure time, by the gray level and/or color level control. Thus, the exposure time can advantageously remain constant for all bitmaps.

The invention will be described in more detail on the basis of further exemplary embodiments with reference to the attached Figures; however, the invention is by no means limited to the described embodiments and examples and drawings but can instead comprise any variations and modifications within the scope of the claims.

Figure 7:
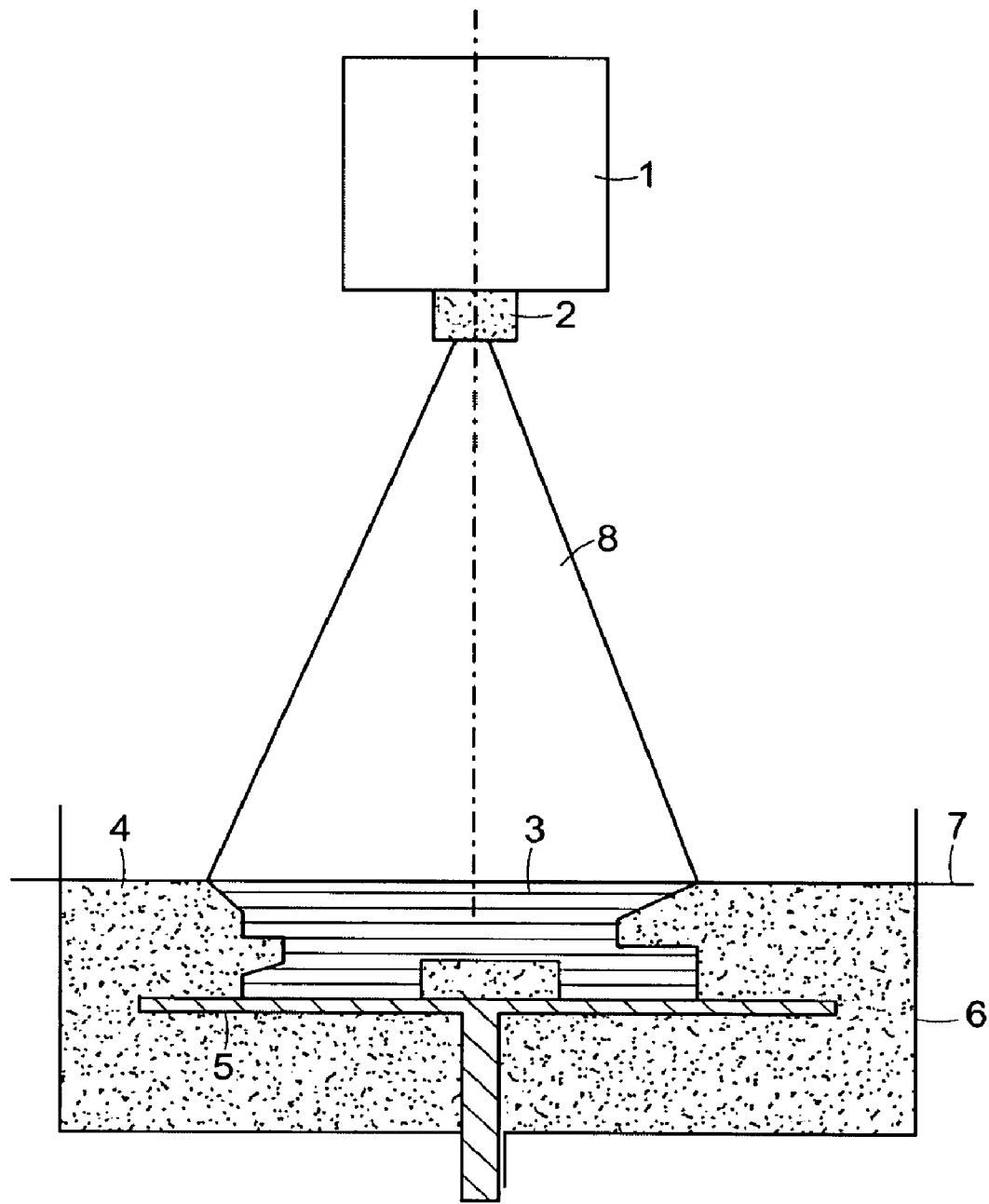
FIG. 7 shows schematically a basic device which can be used for generating a three-dimensional object according to the present invention; wherein the three-dimensional object is built in the form of layers in this embodiment.

FIG. 7 shows schematically a basic device for generating a three-dimensional object 3 by hardening of a photo-hardening material 4 by means of mask projection 8, wherein the projection unit 1 with imaging optics 2 is provided above basin 6 being filled with photo-hardening material 4 and hardens the object 3 on a support plate 5 which can be moved in vertical direction within the basin 6.

Figure 8:
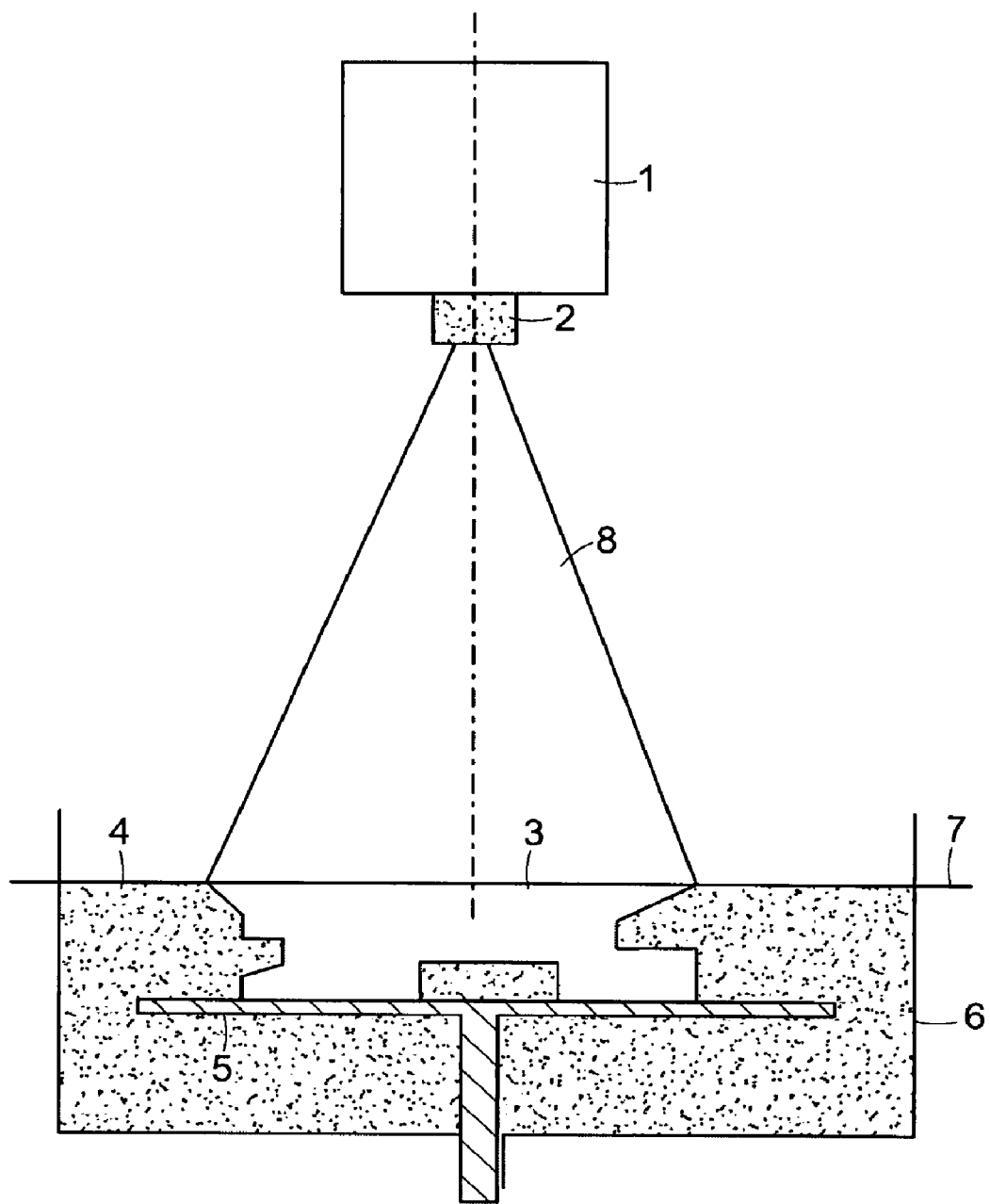
FIG. 8 shows schematically a basic device which can be used for generating a three-dimensional object according to the present invention; wherein the three-dimensional object is built in this embodiment independent from layers.

In the illustrated embodiment, the building of the three-dimensional object 3 is carried out in layers. However, the building can be alternatively carried out independently from layers. Other design options are possible. For example, the hardening process can be carried out continuously without layers; discontinuously (either with same or different or variable layer thicknesses); partially continuously and partially discontinuously (discontinuously either with same or different or variable layer thicknesses); or in a combination of various possibilities. As an example, FIG. 8 schematically shows an illustrative embodiment as an alternative to the device shown in FIG. 7, where same reference signs denote corresponding components but where the three-dimensional object 3 is built independent from any layers.

The device and process according to the present invention is particularly suitable for building a three-dimensional object independent from layers.

With a method based on photo-polymerization, the light radiation necessary for hardening will be projected into the processing plane. Exposure will be effected by means of a multimedia projector. The image is here composed of individual image points (pixels) to a so-called bitmap. The bitmap mask will be formed by a Spatial Light Modulator, wherein the pixels are arranged in a mutually spatially fixed manner in the plane. A currently typical, exemplary resolution for such semiconductor elements is SXGA+, 1400×1050 pixels.

Gray Level Control/Macro-Adjustment

Macro-adjustment concerns the balancing of native deviations in the light output distribution over the entire image area, which are caused by the optical system or, respectively, its error, by means of a gray or color mask compensation.

For this, multiple measuring values are recorded uniformly distributed over the entire image surface, and a compensation mask of gray values or color values is calculated, said compensation mask being laid over or superposed on each individually projected bitmap mask.

Due to this method, the homogeneity is improved at least by a factor of two.

The measurements can be either manually recorded or determined via a sensor matrix.

Figure 2:
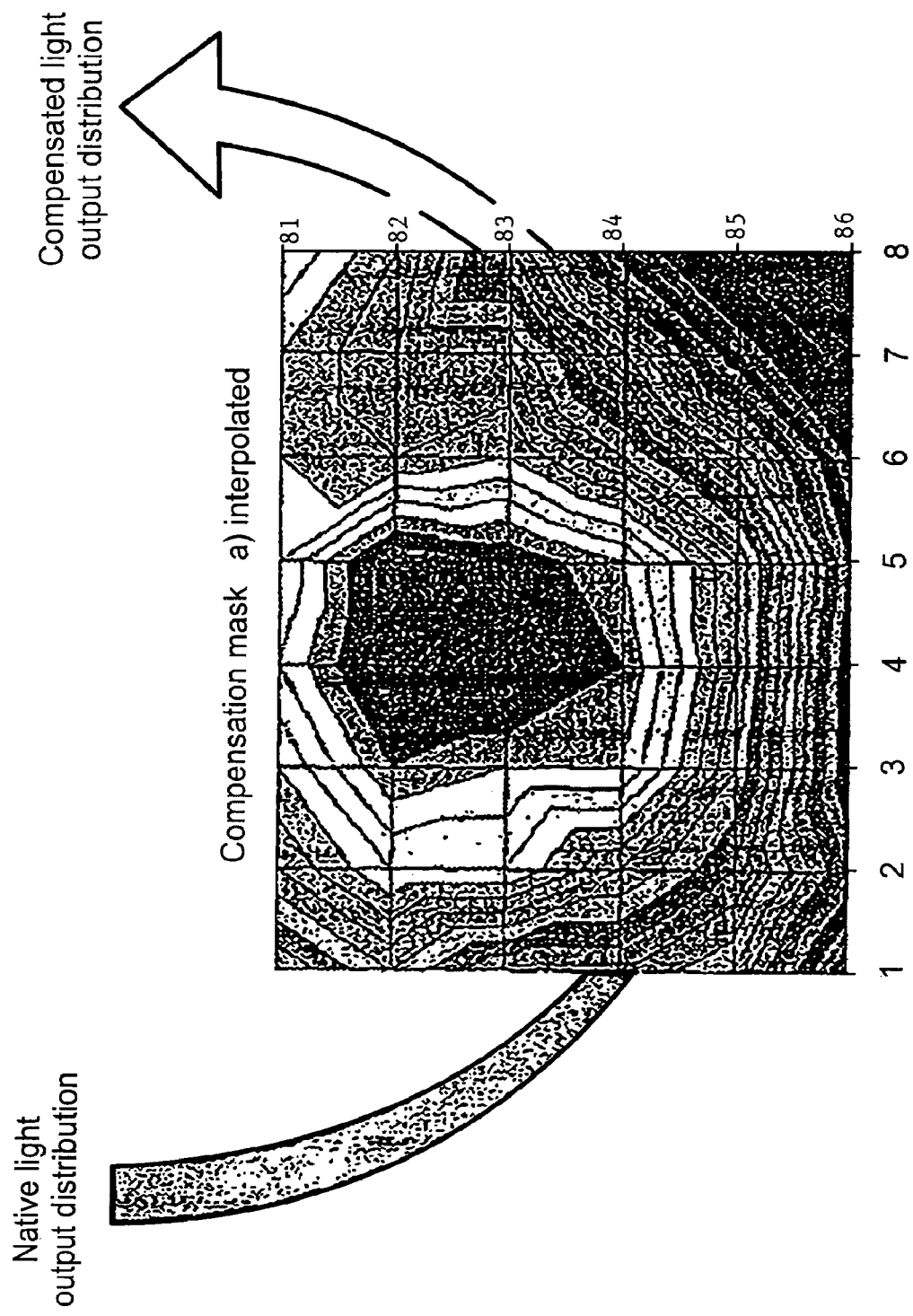
FIG. 2 schematically shows another concept of the present invention concerning gray value or color value adjustment on a macroscopic level according to another embodiment, wherein interpolation is used between individual measuring points to generate a compensation mask.

Simple tiling can be used with the compensation mask (FIG. 1) as one embodiment of the compensation mask; as another embodiment, the compensation gray values or color values between the individual measuring points can be interpolated (FIG. 2) and thus a compensation mask can be generated with soft/continuous transitions between the individual measuring points.

Gray Level Control/Micro-Adjustment

Micro-adjustment concerns obtaining the most faithful image of the cross-sectional area to be projected with the maximum precision and to also keep the exposure and hardening parameters over the structure to be exposed either constant or to influence them specifically and pixel-precisely by gray-value or color-value controlled overexposure or underexposure.

Application Examples

Pixel-Precise Adjustment of Gray Values with Structures Smaller than 3×3 Pixels to be Exposed in the Imaging Plane With a structural size of 1.5×1.5 pixels, it can happen here that—due to an unfavorable pixel/bitmap distribution or, respectively raster with a purely black/white conversion—either only one pixel or even 3×3 pixels are switched white. With yet smaller structures in 1 pixel size, a complete loss of the structure to be imaged in the bitmap can even occur.

To prevent this, each pixel is allocated a corresponding gray value depending on the degree of overlapping by the structure to be imaged. This comes to bear especially in the contour area of the structure.

Figure 3:
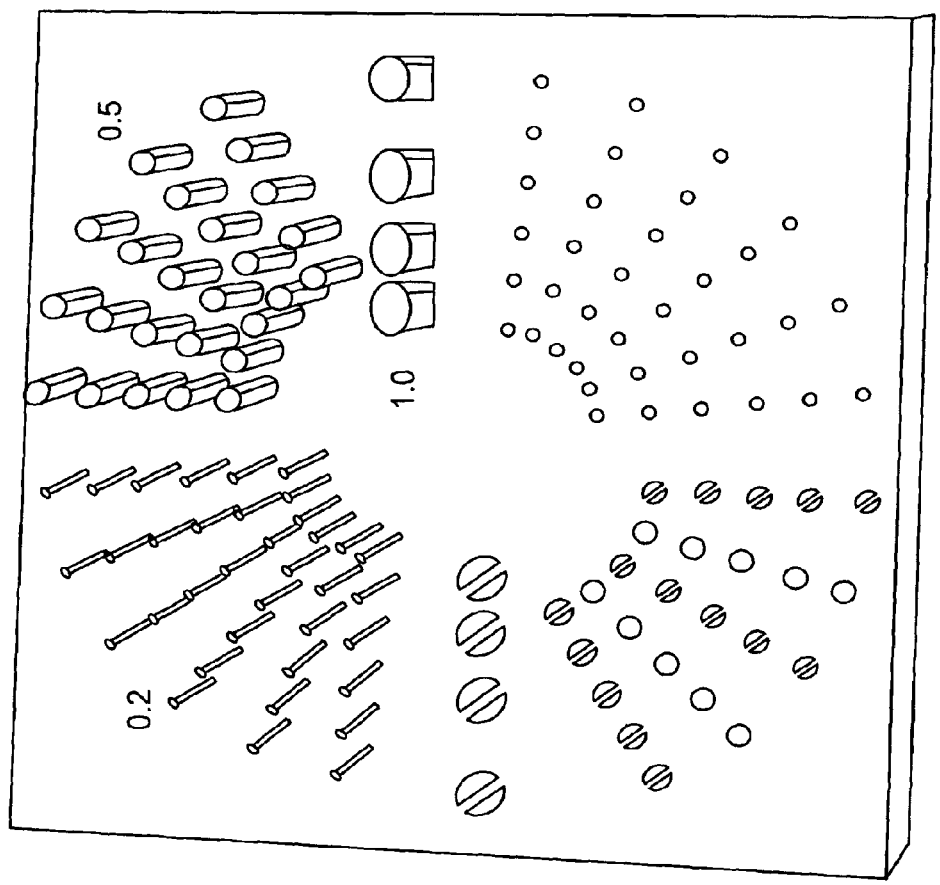
FIG. 3 schematically shows a geometry of a model for a three-dimensional object comprising differently sized holes and cylinders, as a basis for the generation of a bitmap.

The principle is here presented on the basis of a structure which comprises small holes as well as small cylinders of various sizes (diameter 200, 500 and 1000 μm) (FIG. 3), from whose cross-sectional areas one bitmap mask will be generated respectively.

From the resolution of the raster—here 1280×1024 pixels—and the size of the structural field—here 317.5×254 mm—a pixel size of 248 μm will result.

It should be noted that the smallest structure is here smaller than one pixel!

By means of two different bitmapping strategies, the improvement through gray value or color value adjustment will be shown:

Bitmapping Strategy with Purely Black/White Pixels

The inside area of the contour is filled with pixels.

Outside contours (mass on the inside) are filled with white pixels.

Inside contours (hollow space on the inside) are filled with black pixels.

Pixels touch the contour line only if the pixel is at least 50% covered over by the inside area.

Figure 4:
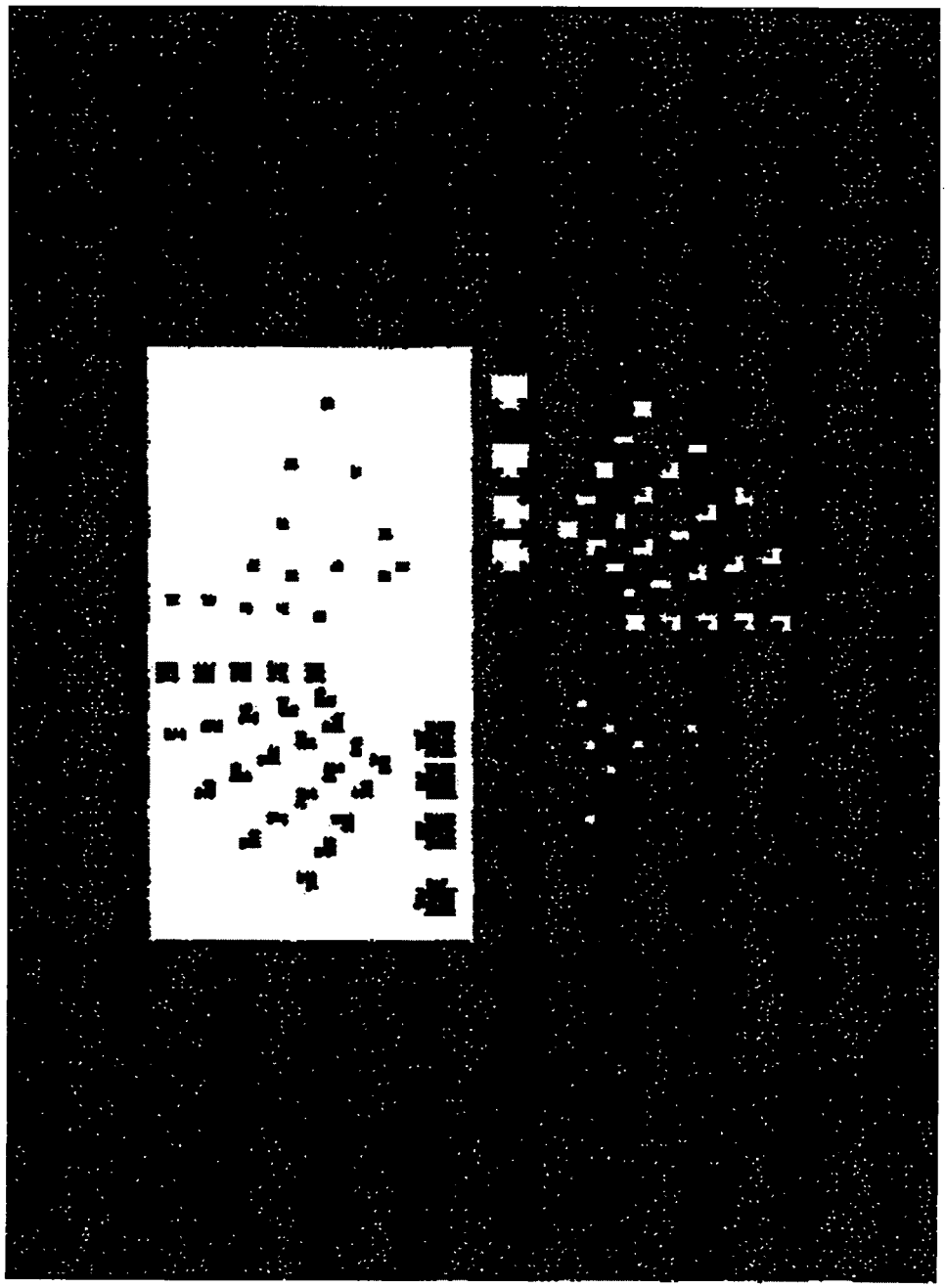
FIG. 4 schematically shows a comparison example of generating a bitmap without pixel-precise grey value or color value adjustment or control of the invention.

The bitmap thus generated (FIG. 4) shows clearly missing structures of the size 200 μm in diameter.

The reason is that with these structures, which do not appear in the bitmap, no pixel will be covered by more than 50%, depending on their position in the raster.

Dimensions:

| Original diameter | Bitmap presentation "hole" | | Bitmap presentation "cylinder" | |
|---|---|---|---|---|
| 200 μm | 1 pixel | 248 μm | 1 pixel | 248 μm |
| 500 μm | 2 pixels | 496 μm | 2 pixels | 496 μm |
| 1000 μm | 4 pixels | 992 μm | 4 pixels | 992 μm |

Bitmapping Strategy with Pixel-Precise Gray Value Adjustment:

The inside area of the contour is filled with pixels.

Outside contours (mass on the inside) are filled with "light" pixels.

Inside contours (hollow space on the inside) are filled with "dark" pixels.

The pixel lightness or, respectively, its gray value depends on the degree of overlapping by the inside area.

Figure 5:
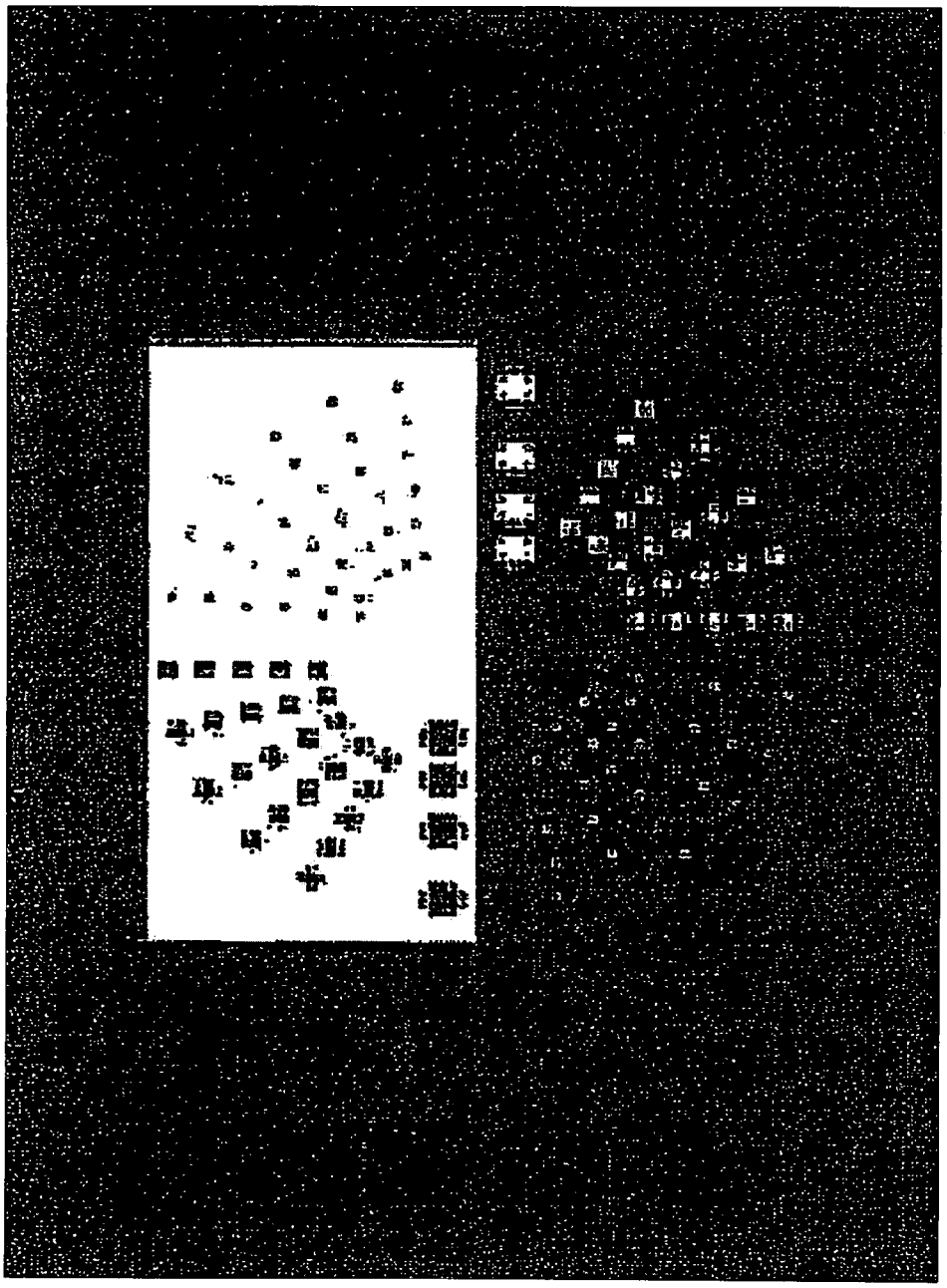
FIG. 5 schematically shows an example of generating a bitmap with pixel-precise grey value or color value adjustment or control on a microscopic level according to an embodiment of the present invention, the adjustment or control depending on a degree of overlapping of raster pixels by the vector graphic.

The thus generated bitmap (FIG. 5) will render all structures/geometries visible. The 200 µm cylinders are too dark and the 200 µm holes are too light. The reason for it is that, no pixel will appear overlapped at 100% and thus no pixel will be presented 100% white (with outside contours) or 100% black (with inside contours), depending on the position of the contours in the pixel raster.

Dimensions:

| Original diameter | Bitmap presentation "hole" | | Bitmap presentation "cylinder" | |
|---|---|---|---|---|
| 200 µm | ~1 pixel | ~248 µm | ~1 pixel | ~248 µm |
| 500 µm | ~2 pixels | ~496 µm | ~2 pixels | ~496 µm |
| 1000 µm | ~4 pixels | ~992 µm | ~4 pixels | ~992 µm |

Smoothing the Outside and Inside Contours of the Structures to be Exposed

Here, the antialiasing effect already known in digital image processing will be utilized.

A known problem of rasterization is the alias effect. If a gray value depth of more than 1 bit is available for the raster graphics to be generated, this effect can be reduced by means of "edge smoothing" (antialiasing). Different B/W filter methods are available for this.

Figure 6:
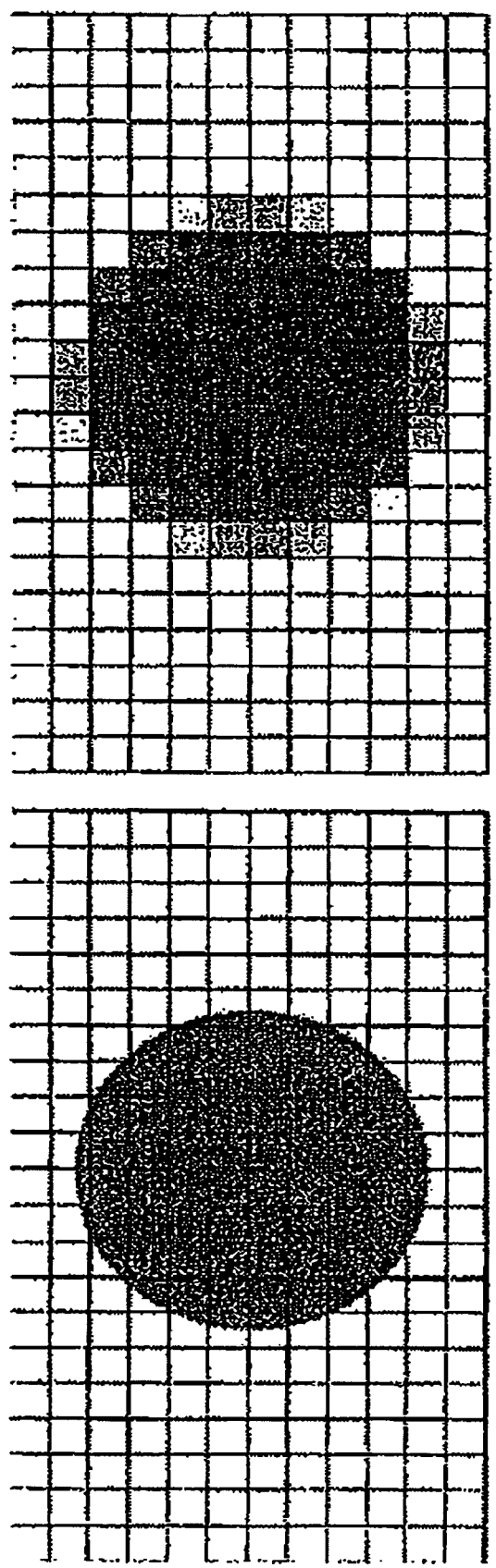
FIG. 6 shows, on the left-hand presentation, a vector-based starting image of a cross-sectional structure to be imaged, with superimposed raster (pixels are here represented as squares); on the right-hand presentation the generated bitmap based on raster graphic is shown, here with edge smoothing according to an embodiment of the present invention obtained by grey value or color value adjustment on a microscopic level depending on whether, and by which extend, pixels are crossed over by the graphics such that they are provided with a correspondingly weighted gray value.

With antialiasing of the bitmap output, the so-called aliasing artifacts, an effect of aliasing, will be removed which occur in the raster of a vector graphic (here the cross-sectional structure to be exposed (FIG. 6).

When drawing a line, only horizontal and vertical lines can be drawn without any problem whose line thickness is a multiple of the pixel space and whose starting and end point lies on a pixel. If a line is somewhat inclined, aliasing artifacts will inevitably occur. The same also happens with all round/free forms. The effect will become all the more pronounced, the coarser the resolution.

In antialiasing of vector graphics, it is taken into account which pixels are crossed over how much by the graphics; and they are provided with a correspondingly weighted gray value. The pixels are here usually viewed as squares. The more of the pixel surface is covered by the graphics, the lighter the gray value of the pixel will be adjusted. Special software filters are used for implementation.

By this method, the hardening behavior of the material will finally also be accordingly influenced, and a higher precision is thus achieved in the final component.

The imaging imprecision of the projection optics and the photopolymer can additionally exercise a deep pass filter function which can result, on the one hand, in a further smoothing effect of the component surface, but, on the other hand, also in a more imprecise component or, respectively, in a loss of detail.

Controlling the Hardening Depth by Means of the Gray Level Control as a Function of the Cross-Sectional Structure to be Imaged/Component Geometry to be Imaged Hardening Depth with Large Surface Structures Versus Filigree Cross-Sectional Structures With larger structure areas, more light output per area is available than with filigree structures; this phenomenon results in different hardening in xy-extension (beyond the contour) and z-extension (depth).

If, for example, a 10 mm×10 mm large surface is exposed once, it will harden e.g. to a thickness of 130 µm; however, with the same exposure time, a structure of 2 mm×10 mm will harden only 100 µm. If the component is now built for example in 100 µm layers or in a corresponding voxel matrix, it may happen that, in the filigree portion, the generated solidified material will not enter into sufficient chemical bonding through overexposure (130 µm depth hardening up to 30% into the preceding layer), that the hardened material will be separated in this portion, and that the component is defective. This phenomenon is particularly critical with filigree supporting structures.

Based on special algorithms, structures of different area expansions will be identified in the cross-sectional image and will be allocated pixel-precisely to corresponding gray values to obtain a uniform hardening depth (Z) and extension (XY) over the entire structural area to be exposed (larger area structures will here be darkened according to their extension).

Higher Green Compact Hardness with Massive Structures/Higher Material Accumulations within One Component With some components, there are volume portions with an accumulation of material whose wall thickness on the one hand exceeds the maximum possible hardening depth of the material in post-hardening or which are in a position within the component not reached by light energy or only to a limited extent in the post-hardening process.

Already during the generating process, such volume portions can achieve a higher green compact hardness by being specifically overexposed. This can be carried out by corresponding gray value or color value allocations in a voxel matrix, wherein the hardening depth in Z preferably exceeds a normal hardening depth several-fold.

For all applications described above, the bitmap mask/exposure mask can contain information on black/white, gray value, and or color information by which the exposure energy will be controlled. The individually described embodiments and examples can be combined in any way with each other.

What is claimed is:

1. A device for producing a three-dimensional object from a solidifiable material comprising:
    an imaging unit comprising a predetermined number of discrete imaging elements;
    an imaging unit controller configured to control the discrete imaging elements, wherein each of the discrete imaging elements corresponds to a location on an exposed surface of the solidifiable material and projects electromagnetic radiation based on a corresponding scaled intensity value onto the corresponding location on the exposed surface of the solidifiable material, and each scaled intensity value is based on a corresponding compensation light intensity value and a degree of overlap between the location on the exposed surface of the solidifiable material to which the scaled intensity value corresponds and a graphic depicting the three-dimensional object.

2. The device of claim 1, wherein the imaging unit controller receives data comprising a voxel matrix, and the voxel matrix includes the scaled intensity values corresponding to each location on the exposed surface of the solidifiable material.

3. The device of claim 1, wherein the imaging unit controller comprises at least one selected from the group consisting of a computer, an integrated circuit, and software.

4. The device of claim 1, wherein each corresponding compensation light intensity value is selected from the group consisting of a measured light intensity value and a light intensity value interpolated from measured light intensity values.

5. The device of claim 4, wherein each measured light intensity value is determined by measuring a light intensity at a selected location on an image surface, and each selected location on the image surface corresponds to a location on the exposed surface of the solidifiable material.

6. The device of claim 1, wherein the imaging unit controller projects electromagnetic radiation for a plurality of exposure times, each exposure time corresponds to one of a plurality of bitmaps, and each exposure time in the plurality of exposure times is the same.

7. The device of claim 1, wherein the graphic depicting the object defines first and second object areas, the scaled energy values for the first object area differ from the scaled energy values for the second object area, and the imaging unit projects electromagnetic radiation to a first set of locations on the exposed surface of the solidifiable material corresponding to the first object area and to a second set of locations on the exposed surface of the solidifiable material corresponding to the second object area such that the solidifiable material at the first set of locations is solidified to the same depth as the solidifiable material at the second set of locations.

8. The device of claim 1, wherein the exposed surface of the solidifiable material comprises a plurality of regions, each region includes a plurality of the locations on the exposed surface of the solidifiable material, and the compensation light intensity value within each region is constant across all of the locations within the region.

9. The device of claim 8, wherein the plurality of regions comprises a first subset of regions having a first exposed surface area and a second subset of regions having a second exposed surface area, the first exposed surface area is greater than the second exposed surface area, and the compensation light intensity value for the first subset of regions is greater than the compensation light intensity value for the second subset of regions.

10. The device of claim 1, wherein each compensation light intensity value corresponds to one of the locations on the exposed surface of the solidifiable material and one of the discrete imaging elements.

11. The device of claim 1, wherein the imaging unit is included in a projection unit.

12. The device of claim 1, wherein the imaging unit is a spatial light modulator.

13. The device of claim 1, wherein the scaled intensity value is selected from the group consisting of a gray scale value and a color value.

14. A method of producing a three-dimensional object from a solidifiable material, comprising:
projecting electromagnetic radiation to each location in a plurality of locations on an exposed surface of the solidifiable material based on a scaled intensity value corresponding to the location, wherein each scaled intensity value is based on a corresponding compensation light intensity value and a degree of overlap between the location on the exposed surface of the solidifiable material to which the scaled intensity value corresponds and a graphic depicting the three-dimensional object.

15. The method of claim 14, wherein each corresponding light intensity value is selected from the group consisting of a measured light intensity value and a light intensity value interpolated from measured light intensity values.

16. The method of claim 15, further comprising measuring a plurality of light intensity values at selected locations on an image surface to obtain the measured light intensity values, wherein each location on the image surface corresponds to a location on the surface of the solidifiable material.

17. The method of claim 16, further comprising interpolating between the measured light intensity values to obtain the interpolated light intensity values.

18. The method of claim 15, wherein each measured light intensity value is determined by measuring a light intensity at a selected location on an image surface, and each selected location on the image surface corresponds to a location on the exposed surface of the solidifiable material.

19. The method of claim 14, wherein the imaging unit controller projects electromagnetic radiation for a plurality of exposure times, wherein each exposure time corresponds to one of a plurality of bitmaps, and each exposure time is the same.

20. The method of claim 14, wherein the graphic depicting the object defines first and second object areas, the scaled energy values for the first object area differ from the scaled energy values for the second object area, and the imaging unit projects electromagnetic radiation to a first set of locations on the exposed surface of the solidifiable material corresponding to the first object area and to a second set of locations on the exposed surface of the solidifiable material corresponding to the second object area such that the solidifiable material at the first set of locations is solidified to the same depth as the solidifiable material at the second set of locations.

* * * * *